US008278222B2

(12) United States Patent
Wu et al.

(10) Patent No.: US 8,278,222 B2
(45) Date of Patent: Oct. 2, 2012

(54) SELECTIVE ETCHING AND FORMATION OF XENON DIFLUORIDE

(75) Inventors: Dingjun Wu, Macungie, PA (US); Eugene Joseph Karwacki, Jr., Orefield, PA (US); Anupama Mallikarjunan, Macungie, PA (US); Andrew David Johnson, Doylestown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 311 days.

(21) Appl. No.: 12/360,588

(22) Filed: Jan. 27, 2009

(65) Prior Publication Data
US 2010/0022095 A1 Jan. 28, 2010

Related U.S. Application Data

(63) Continuation-in-part of application No. 11/285,056, filed on Nov. 22, 2005, now abandoned.

(51) Int. Cl.
*H01L 21/302* (2006.01)
*H01L 21/461* (2006.01)

(52) U.S. Cl. ......... 438/706; 438/707; 438/708; 438/719

(58) Field of Classification Search .................. None
See application file for complete search history.

(56) References Cited

U.S. PATENT DOCUMENTS

| 5,002,632 | A | 3/1991 | Loewenstein et al. | |
|---|---|---|---|---|
| 5,384,009 | A | 1/1995 | Mak et al. | |
| 5,421,957 | A | 6/1995 | Carlson et al. | |
| 5,445,710 | A | 8/1995 | Hori et al. | |
| 6,051,502 | A | 4/2000 | Frankamp et al. | |
| 6,136,214 | A | 10/2000 | Mori et al. | |
| 6,221,169 | B1 | 4/2001 | Bernstein et al. | |
| 6,254,792 | B1 * | 7/2001 | Van Buskirk et al. | 216/13 |
| 6,355,181 | B1 * | 3/2002 | McQuarrie | 216/2 |
| 6,736,987 | B1 * | 5/2004 | Cho | 216/58 |
| 6,870,654 | B2 | 3/2005 | Lin et al. | |
| 6,902,947 | B2 * | 6/2005 | Chinn et al. | 438/48 |
| 7,026,235 | B1 | 4/2006 | Ben-Tzur et al. | |
| 7,078,293 | B2 | 7/2006 | Lin et al. | |

(Continued)

FOREIGN PATENT DOCUMENTS
CA 1108513 A 9/1981
(Continued)

OTHER PUBLICATIONS
Wikipedia, Xenon difluoride, 2011.*
(Continued)

*Primary Examiner* — Duy Deo
(74) *Attorney, Agent, or Firm* — Lina Yang

(57) ABSTRACT

This invention relates to a process for selective removal of materials, such as: silicon, molybdenum, tungsten, titanium, zirconium, hafnium, vanadium, tantalum, niobium, boron, phosphorus, germanium, arsenic, and mixtures thereof, from silicon dioxide, silicon nitride, nickel, aluminum, TiNi alloy, photoresist, phosphosilicate glass, boron phosphosilicate glass, polyimides, gold, copper, platinum, chromium, aluminum oxide, silicon carbide and mixtures thereof. The process is related to the important applications in the cleaning or etching process for semiconductor deposition chambers and semiconductor tools, devices in a micro electro mechanical system (MEMS), and ion implantation systems. Methods of forming $XeF_2$ by reacting Xe with a fluorine containing chemical are also provided, where the fluorine containing chemical is selected from the group consisting of $F_2$, $NF_3$, $C_2F_6$, $CF_4$, $C_3F_8$, $SF_6$, a plasma containing F atoms generated from an upstream plasma generator and mixtures thereof.

9 Claims, 6 Drawing Sheets

FTIR SPECTRA FROM Ar/NF3 AND Xe/NF3.

U.S. PATENT DOCUMENTS

| | | | |
|---|---|---|---|
| 2003/0047691 | A1 | 3/2003 | Musil et al. |
| 2004/0069318 | A1 | 4/2004 | Kanayama et al. |
| 2004/0077162 | A1 | 4/2004 | Leeson et al. |
| 2006/0086376 | A1 | 4/2006 | Dimeo, Jr. et al. |
| 2006/0226119 | A1 | 10/2006 | Kannan et al. |
| 2007/0117396 | A1 | 5/2007 | Wu et al. |

FOREIGN PATENT DOCUMENTS

| | | |
|---|---|---|
| EP | 0688045 A1 | 12/1995 |
| EP | 1428907 A1 | 6/2004 |
| EP | 1 788 120 A1 | 5/2007 |
| GB | 2183204 | 6/1987 |
| WO | 2006/078382 A2 | 7/2006 |
| WO | 2007/127865 A2 | 11/2007 |

OTHER PUBLICATIONS

Isaac W.T. Chan, et al, "Gas Phase Pulse Etching of Silicon for MEMS With Xenon Difluoride", IEEE 1999 Canadian Conf. on Elec. and Computer Engrg., Edmonton, Alb. Canada, pp. 1637-1642.

Chu P. B., et al, "Controlled Pulse-Etching with Xenon Difluoride", 1997 International Conference on Solid-State Sensors and Actuators, Digest of Technical Papers, Transducers 97, Chicago, IL, Jun. 16-19, 1997, Sessions 1A1-2D3, Papers No. 1A1.01-2D3.14PL, vol. 1; Jun. 16, 1997; pp. 665-668; XP010240565.

D.L. Flamm, "Introduction to Plasma Chemistry", Chapter 2, pp. 121-122.

S.J. Gross, "Micromachined Switched and Cantilever . . . ", Penn State, Dept. of E.E., Aug. 2004.

K. Sugano, et al, "Effects of Aperture Size and Pressure on XeF2 . . . ", Microsystem Tech. 9, 2002, pp. 11-16.

Floy I. Chang, et al, "Gas-Phase Silicon Micromachining With Xenon Difluoride", SPIE, 2641, pp. 117-128.

S. Sugahara, et al, "Preparation and Characterization of Low-k Silica . . . ", Elec. Soc., 148(6), 2001, pp. 120-126.

Sylvia T. Ceyer, et al, "COLL 430 Gas-phase Dissociation of a Vibrationally Excited . . . ," Dept. of Chem., MIT, 225th ACS Nat. Mtg., 2003.

J.R. Holt, et al, "Comparision of the Interactions of XeF2 and F2 . . . ", J. Phys. Chem., B., 106, 2002, pp. 8399-8406.

H.F. Winters, et al, The Etching of Silicon with XeF2 Vapor, Appl. Phys. Lett. 34(1), 1979, pp. 70-73.

Kirt R. Williams, et al, "Etch Rates for Micromachining Processing"; Journal of Microelectromechanical Systems, IEEE Service Center, Piscataway, NJ; vol. 5, No. 4; Dec. 1996; XP011034726.

Abe T, et al, "Study of Mask Process Development for EUVL"; Proceedings of the SPIE—The International Society for Optical Engineering Spie-Int. Soc. Opt. Eng USA; vol. 5446, No. 1; 2004; pp. 832-840; XP02425345.

Watanabe Morimichi, et al, "Thermal Reaction of Polycrstalline ALN with XeF2"; Journal of Vacuum Science and Technology A. Vacuum, Surfaces and Films, American Institute of Physics, New York, NY; vol. 23, No. 6; Oct. 24, 2005; pp. 1647-1656; XPO12074187.

Muthukumaran P, et al, "Gas-Phyase Xenon Difluoride Etching of Microsystems Fabricated Through the Mitel 1.5-MUM CMOS Process Gravure Par Diluorure De Xenon Gazeux De Microsystemes Fabriques Avec Le Procede Mitel CMOS 1.5 MUM"; Canadian Journal of Electrical and Computer Engineering/Revue Canadienne De Genie Electrique and Informatique, Canadian Society for Electrical and Computer, CA; vol. 25, No. 1; Jan. 2000; pp. 35-41; XP009053570.

Nim H. Tea, et al, "Hybrid Postprocessing Etching for CMOS-Compatible MEMS"; Journal of Microelectromechanical Systems, IEEE Service Center, Piscataway, NJ; vol. 6, No. 4; Dec. 1997; pp. 363-372; XP011034771.

* cited by examiner

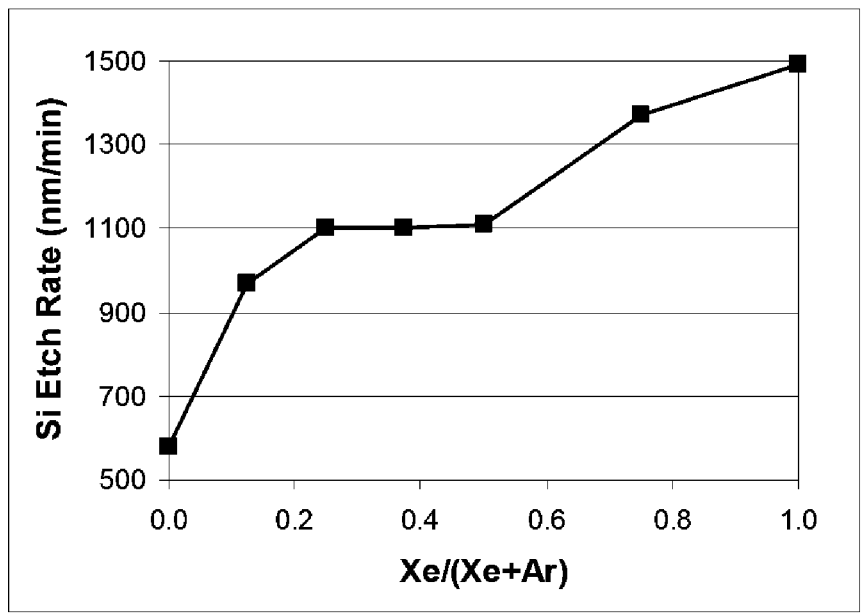
FIGURE 1. EFFECTS OF Xe ADDITION ON Si ETCHING AT VARIOUS Xe/(Xe+Ar) RATIOS.
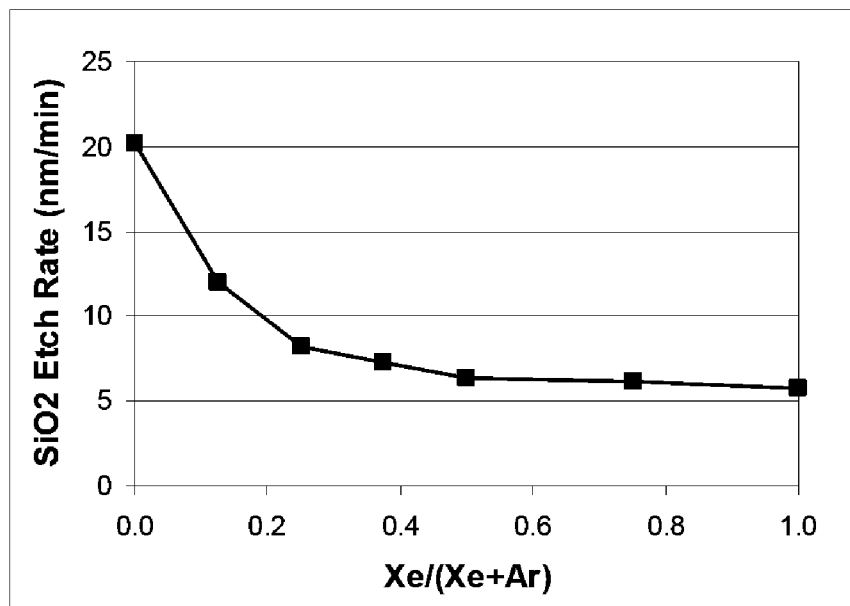
FIGURE 2. EFFECTS OF Xe ADDITION ON $SiO_2$ ETCHING AT VARIOUS Xe/(Xe+Ar) RATIOS.

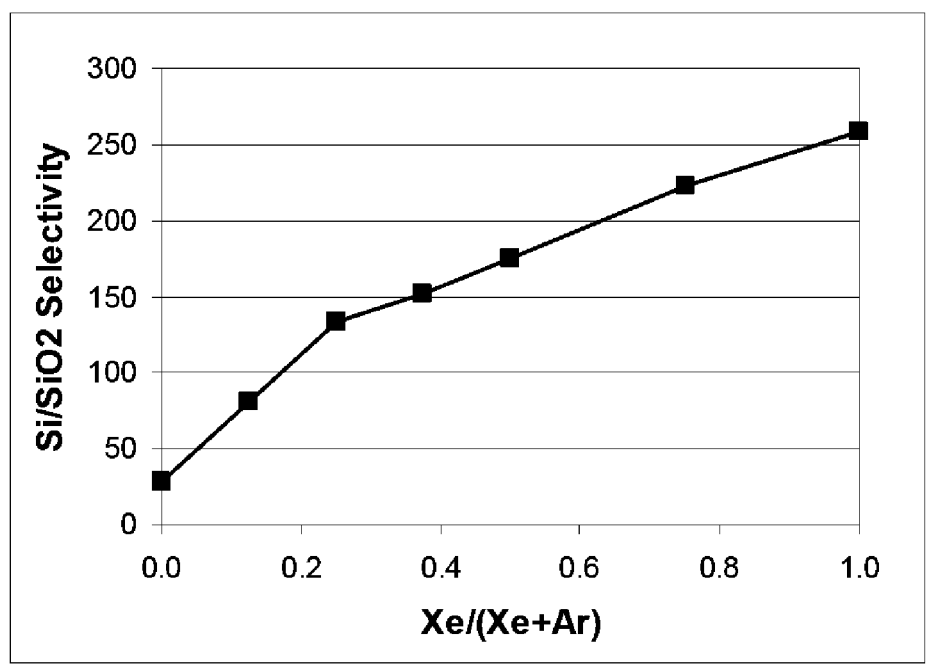
FIGURE 3. EFFECTS OF Xe ADDITION ON Si/SiO$_2$ SELECTIVITY AT VARIOUS Xe/(Xe+Ar) RATIOS.

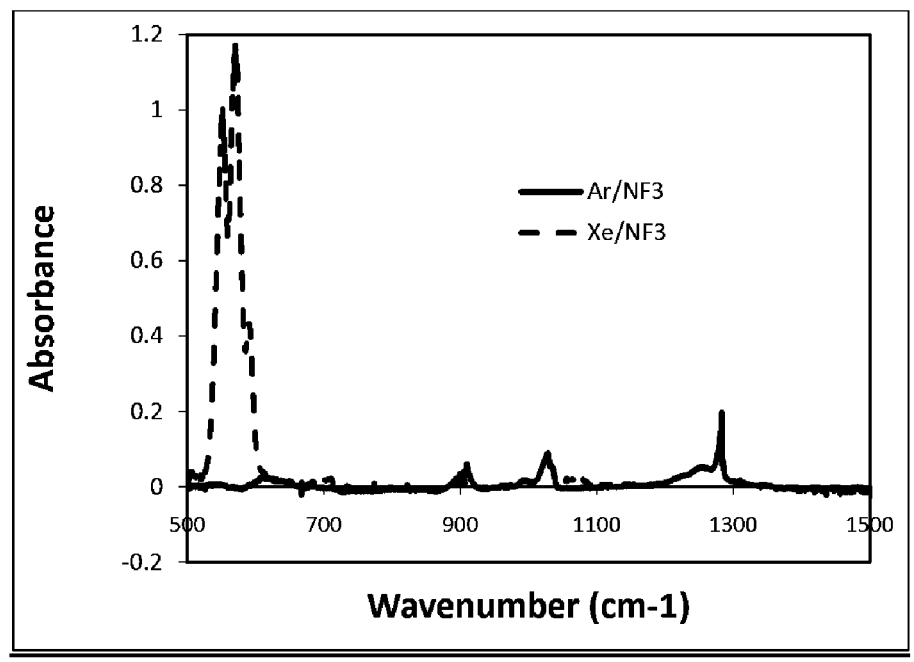
Figure 4. FTIR SPECTRA FROM Ar/NF3 AND Xe/NF3.
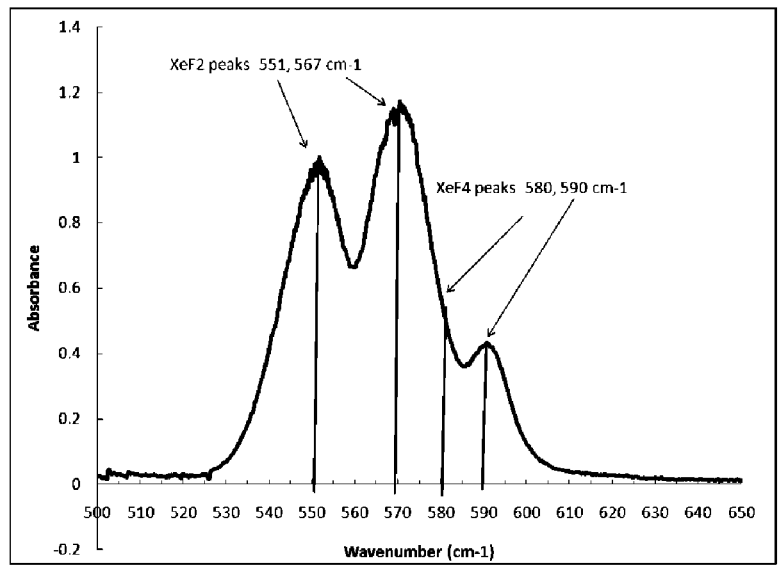
Figure 5. FTIR SPECTRA FROM Xe/NF3.

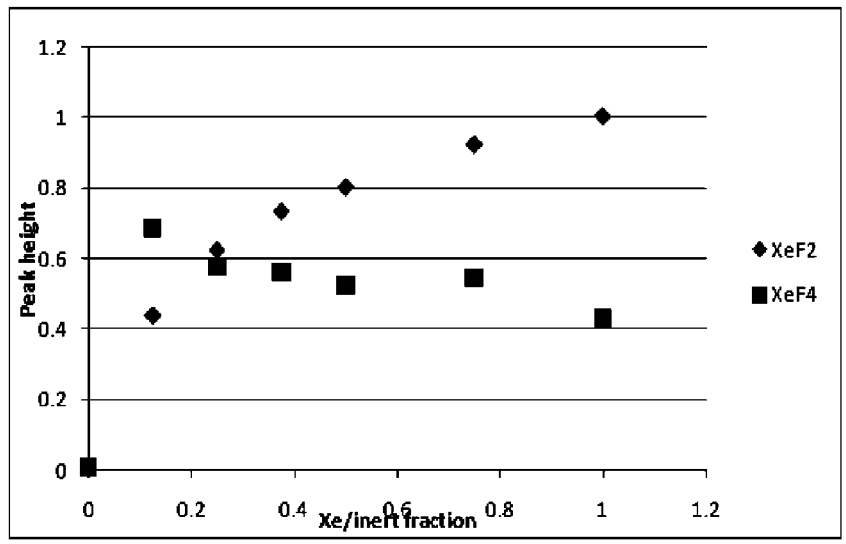
Figure 6. XeF$_2$ AND XeF$_4$ FTIR PEAK HEIGHTS VS Xe/(Xe+Ar).
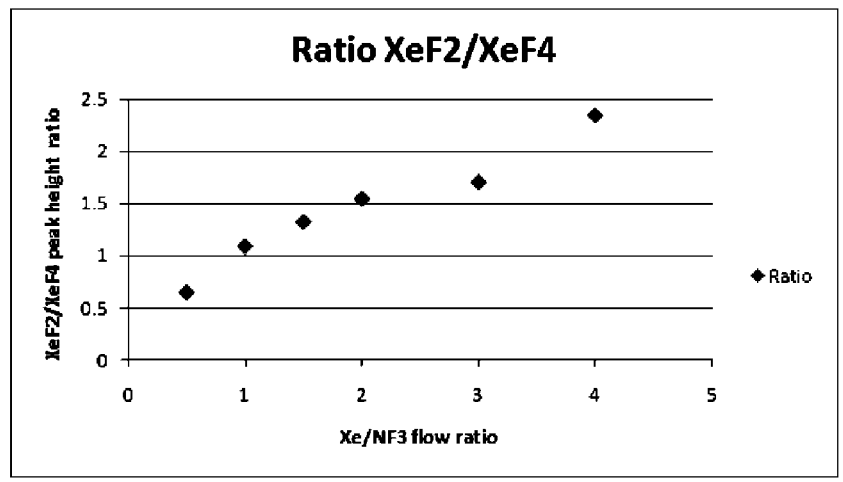
Figure 7. XeF$_2$ AND XeF$_4$ FTIR PEAK HEIGHTS VS Xe/NF$_3$ FLOW RATIO.

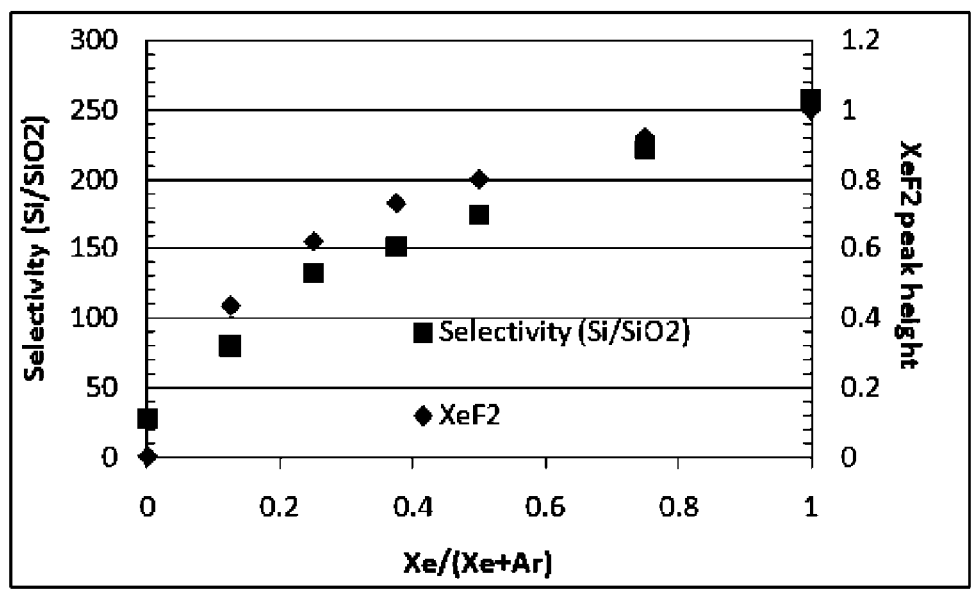
Figure 8. XeF2 FTIR PEAK HEIGHT VS ETCH SELECTIVITY.
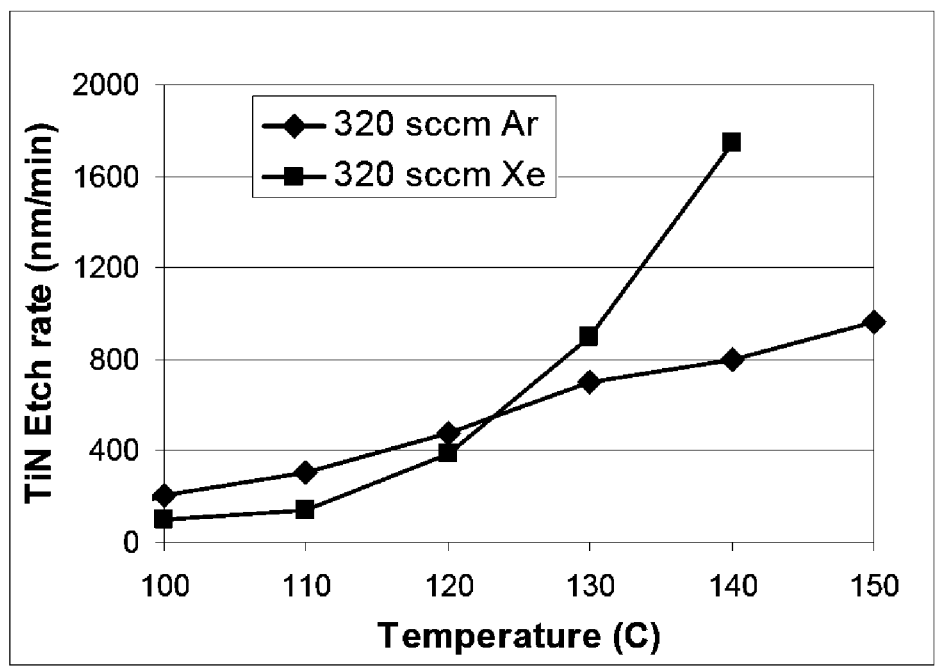
FIGURE 9. EFFECTS OF Xe ADDITION ON TiN ETCHING AT VARIOUS SUBSTRATE TEMPERATURES.

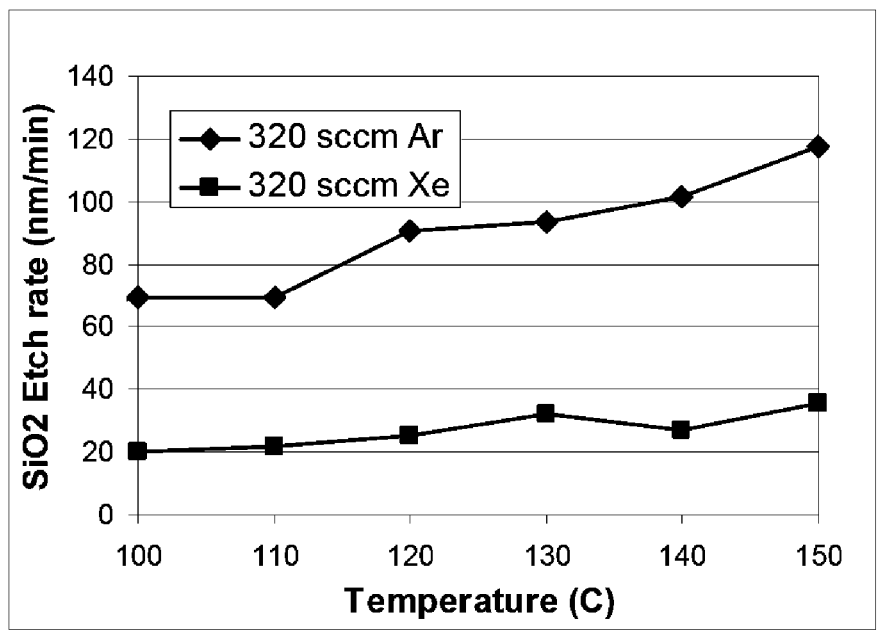
FIGURE 10. EFFECTS OF Xe ADDITION ON $SiO_2$ ETCHING AT VARIOUS SUBSTRATE TEMPERATURES.
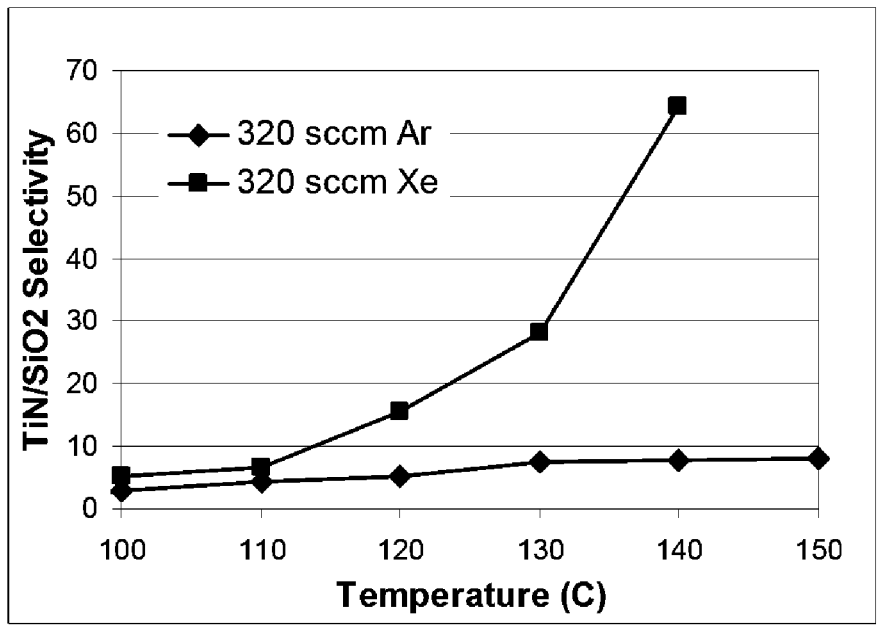
FIGURE 11. EFFECTS OF Xe ADDITION ON $TiN/SiO_2$ SELECTIVITY AT VARIOUS SUBSTRATE TEMPERATURES.

US 8,278,222 B2

SELECTIVE ETCHING AND FORMATION OF XENON DIFLUORIDE

CROSS-REFERENCE TO RELATED APPLICATIONS

This application is a continuation-in-part of U.S. patent application Ser. No. 11/285,056, filed Nov. 22, 2005, entitled "SELECTIVE ETCHING OF TITANIUM NITRIDE WITH XENON DIFLUORIDE".

BACKGROUND OF THE INVENTION

In the electronics industry various deposition techniques have been developed wherein selected materials are deposited on a target substrate to produce electronic components such as semiconductors. One type of deposition process is chemical vapor deposition (CVD), wherein gaseous reactants are introduced into a heated processing chamber resulting in films being deposited on the desired substrate. One subtype of CVD is referred to a plasma enhanced CVD (PECVD) wherein a plasma is established in the CVD processing chamber.

Generally, all methods of deposition result in the accumulation of films and particulate materials on surfaces other than the target substrate, that is, the deposition materials also collect on the walls, tool surfaces, susceptors, and on other equipment used in the deposition process. Any material, film and the like that builds up on the walls, tool surfaces, susceptors and other equipment is considered a contaminant and may lead to defects in the electronic product component.

It is well accepted that deposition chambers, tools, and equipment must be periodically cleaned to remove unwanted contaminating deposition materials. A generally preferred method of cleaning deposition chambers, tools and equipment involves the use of perfluorinated compounds (PFC's), e.g., $C_2F_6$, $CF_4$, $C_3F_8$, $SF_6$, and $NF_3$ as etchant cleaning agents. In these cleaning operations a chemically active fluorine species, which is normally carried in a process gas, converts the unwanted and contaminating residue to volatile products. Then, the volatile products are swept with the process gas from the reactor.

Ion implantation is used in integrated circuit fabrication to accurately introduce controlled amounts of dopant impurities into semiconductor wafers and is a crucial process in microelectronic/semiconductor manufacturing. In the ideal case, all feedstock molecules would be ionized and extracted, but in reality a certain amount of feedstock decomposition occurs, which results in the deposition on and contamination on the surfaces in the ion source region, or parts of the ion implanter tool, such as, low voltage insulators and the high voltage components. The known contamination residues are silicon, boron, phosphorus, germanium or arsenic. It would be a significant advance in the art of ion implantation to provide an in situ cleaning process for the effective, selective removal of unwanted residues deposited throughout the implanter, particularly in the ion source region, during implantation. Such in situ cleaning would enhance personnel safety and contribute to stable, uninterrupted operation of the implantation equipment. A gas-phase reactive halide composition, e.g., XeF2, NF3, F2, XeF6, SF6, C2F6, IFs or IF7, is introduced to the contaminated parts for sufficient time and under sufficient conditions to at least partially remove the residue from the components, and to do so in such a manner that residue is removed selectively with respect to the materials from which the components of the ion implanter are constructed.

In a micro electro mechanical system (MEMS), a mixture of sacrificial layers (usually with amorphous silicon) and protective layers, thus device structure layers, are formed. Selectively removing the sacrificial materials is a critical step for the structure release etching process, where several microns of sacrificial material need to be removed isotropically without damaging other structures. It has been understood that the etching process is a selective etching process that does not etch the protective layers. Typical sacrificial materials used in MEMS are: silicon, molybdenum, tungsten, titanium, zirconium, hafnium, vanadium, tantalum, niobium. Typical protective materials are nickel, aluminum, photoresist, silicon oxide, silicon nitride.

In order to efficiently remove the sacrificial material, the release etching utilizes an etchant gas capable of spontaneous chemical etching of the sacrificial layers, preferably isotropic etching that removes the sacrificial layers. Because the isotropic etching effect of xenon difluoride is great, xenon difluoride ($XeF_2$) is used as the etchant for lateral etching process.

However, xenon difluoride is expensive, and is a material difficult to deal with. Xenon difluoride is unstable on contact with air, light or water vapor (moisture). All xenon fluorides must be protected from moisture, light and air to avoid formation of xenon trioxide and hydrogen fluoride. Xenon trioxide is a colorless, nonvolatile solid that's dangerously explosive. Hydrogen fluoride is not only dangerous, but also reduces efficiency of etching.

Additionally, xenon difluoride is a solid having a low vapor pressure which makes deliver of xenon difluoride to the process chamber difficult.

The following references are illustrative of processes for the deposition of films in semiconductor manufacture and the cleaning of deposition chambers, tools and equipment and the etching of substrates, the etching of sacrificial layers in a MEMS, and for the cleaning of the ion source region in an ion implantation system used in the fabrication of a microelectronic device:

U.S. Pat. No. 5,421,957 discloses a process for the low temperature cleaning of cold-wall CVD chambers. The process is carried out, in situ, under moisture free conditions. Cleaning of films of various materials such as epitaxial silicon, polysilicon, silicon nitride, silicon oxide, and refractory metals, titanium, tungsten and their silicides is effected using an etchant gas, e.g., nitrogen trifluoride, chlorine trifluoride, sulfur hexafluoride, and carbon tetrafluoride.

U.S. Pat. No. 6,051,052 discloses the anisotropic etching of a conduct material using fluorine compounds, e.g., $NF_3$ and $C_2F_6$ as etchants in an ion-enhanced plasma. The etchants consist of a fluorine containing chemical and a noble gas selected from the group consisting of He, Ar, Xe and Kr. The substrates tested include integrated circuitry associated with a substrate. In one embodiment a titanium layer is formed over an insulative layer and in contact with the tungsten plug. Then, an aluminum-copper alloy layer is formed above the titanium layer and a titanium nitride layer formed above that.

US 2003/0047691 discloses the use of electron beam processing to etch or deposit materials or repair defects in lithography masks. In one embodiment xenon difluoride is activated by electron beam to etch tungsten and tantalum nitride.

GB 2,183,204 A discloses the use of $NF_3$ for the in situ cleaning of CVD deposition hardware, boats, tubes, and quartz ware as well as semiconductor wafers. $NF_3$ is introduced to a heated reactor in excess of 350° C. for a time sufficient to remove silicon nitride, polycrystalline silicon, titanium silicide, tungsten silicide, refractory metals and suicides.

Holt, J. R., et al, *Comparison of the Interactions of XeF$_2$ and F$_2$ with Si(100)(2X1)*, J. Phys. Chem. B 2002, 106, 8399-8406 discloses the interaction of $XeF_2$ with Si(100)(2X1) at 250 K and provides a comparison with $F_2$. $XeF_2$ was found to react rapidly and isotropically with Si at room temperature.

Chang, F. I., *Gas-Phase Silicon Micromachining With Xenon Difluoride*, SPIE Vol. 2641/117-127 discloses the use of $XeF_2$ as a gas phase, room temperature, isotropic, silicon etchant and noted that it has a high selectivity for many materials used in microelectromechanical systems such as aluminum, photoresist and silicon dioxide. At page 119 it is also noted that $XeF_2$ has a selectivity of greater that 1000:1 to silicon dioxide as a well as copper, gold, titanium-nickel alloy and acrylic when patterned on a silicon substrate.

Isaac, W. C. et al, *Gas Phase Pulse Etching of Silicon For MEMS With Xenon Difluoride*, 1999 IEEE, 1637-1642 discloses the use of $XeF_2$ as an isotropic gas-phase etchant for silicon. It is reported that $XeF_2$ has high selectivity to many metals, dielectrics and polymers in integrated circuit fabrication. The authors also note at page 1637 that $XeF_2$ did not etch aluminum, chromium, titanium nitride, tungsten, silicon dioxide, and silicon carbide. Significant etching also had been observed for molybdenum:silicon; and titanium:silicon, respectively.

Winters, et al, *The Etching of Silicon With $XeF_2$ Vapor*, Appl. Phys. Lett. 34(1) 1 Jan. 1979, 70-73 discloses the use of F atoms and $CF_3$ radicals generated in fluorocarbon plasma induced dissociation of $CF_4$ in etching solid silicon to produce volatile $SiF_4$ species. The paper is directed to the use of $XeF_2$ to etch silicon at 300 K at $1.4 \times 10^{-2}$ Torr. Other experiments showed that $XeF_2$ also rapidly etches molybdenum, titanium and probably tungsten. Etching of $SiO_2$, $Si_3N_4$ and SiC was not effective with $XeF_2$ but etching was effective in the presence of electron or ion bombardment. The authors concluded that etching of these material required not only F atoms but also radiation or high temperature.

U.S. Pat. Nos. 6,870,654 and 7,078,293 both disclose a structure release etching process by using an etchant having a fluorine group or a chroleine group to replace xenon difluoride, avoiding the difficulties resulting from using the xenon difluoride. However, the etching effect is not as efficient as the use of xenon difluoride. Therefore, U.S. Pat. Nos. 6,870,654 and 7,078,293 disclose a special structure for facilitate the structure release etching process such that the processing time etc is commensurate with that of xenon difluoride.

US20060086376 discloses the use of $XeF_2$ for cleaning the residues (silicon, boron, phosphorus, germanium or arsenic) from the components of the ion implanter, in the fabrication of a microelectronic device.

Specifically, US20060086376 relates to the in situ removal of residue from the vacuum chamber and components contained therein by contacting the vacuum chamber and/or components with a gas-phase reactive halide composition, e.g., $XeF_2$ for sufficient time and under sufficient conditions to at least partially remove the residue from the components, and to do so in such a manner that residue is removed selectively with respect to the materials from which the components of the ion implanter are constructed.

One of industry objectives is to find new etchants that can be used to remove difficult to remove titanium nitride (TiN) films from silicon dioxide ($SiO_2$) and silicon nitride (SiN) coated surfaces. Theses surfaces are found in the walls of semiconductor deposition chambers, particularly quartz chambers and quartz ware, semiconductor tools and equipment. Many of the conventional fluorine based etchants that attack TiN films also attack $SiO_2$ and SiN surfaces and, therefore, unacceptable for removing TiN deposition products from semiconductor deposition chambers and equipment.

Another industry objective is to provide a method for selective removal of silicon, from silicon dioxide (quartz) surfaces such as those commonly found in semiconductor deposition chambers and semiconductor tools, as well as devices in MEMS.

There is yet another industry objective for providing a method for generating or forming xenon difluoride on site as needed for lower cost of ownership.

BRIEF SUMMARY OF THE INVENTION

This invention relates to an improved process for the selective removal of titanium nitride (TiN) films and deposition products from silicon dioxide (quartz) surfaces such as those commonly found in semiconductor deposition chambers and semiconductor tools as well as silicon nitride (SiN) surfaces commonly found in semiconductor tool parts and the like. In a basic process for removing undesired components contaminating a surface an etchant is contacted with the undesired component in a contact zone and the undesired component converted to a volatile species. The volatile species then is removed from the contact zone. The improvement in the basic process for removing undesired TiN deposition materials from a surface selected from the group consisting of $SiO_2$ and SiN in a contact zone resides in employing xenon difluoride ($XeF_2$) as the etchant. Conditions are controlled so that said surface selected from the group consisting of $SiO_2$ and SiN is not converted to a volatile component.

Significant advantages in terms of selective etching of TiN films and deposition materials which are very difficult to remove from semiconductor deposition chambers (sometimes referred to as reaction chambers), tool parts, equipment and the like include:

an ability to selectivity remove TiN films from quartz, i.e., $SiO_2$, and SiN coated surfaces found in the cleaning of deposition chambers;

an ability to remove TiN films from quartz surfaces at modest temperatures; and, an ability to activate perfluoro etching agents in remote plasma to remove TiN films from $SiO_2$ and SiN surfaces without adverse effects normally caused by fluorine atoms attacking in the remote plasma.

The present invention also discloses a process for the selective etching of a first material to a second material, comprising:

providing a structure containing the first material and the second material in a chamber;

providing an etchant gas comprised of xenon(Xe), an inert gas and a fluorine containing chemical to the chamber;

contacting the structure with the etchant gas and selectively converting the first material to a volatile species; and removing the volatile species from the chamber;

wherein the first material is selected from the group consisting of silicon, molybdenum, tungsten, titanium, zirconium, hafnium, vanadium, tantalum, niobium, boron, phosphorus, germanium, arsenic, and mixtures thereof; and the second material is selected from the group consisting of silicon dioxide, silicon nitride, nickel, aluminum, TiNi alloy, photoresist, phosphosilicate glass, boron phosphosilicate glass, polyimides, gold, copper, platinum, chromium, aluminum oxide, silicon carbide, and mixtures thereof.

The present invention also discloses a process of forming xenon difluoride in a chamber, comprising:

providing a fluorine containing chemical selected from the group consisting of $NF_3$, $C_2F_6$, $CF_4$, $C_3F_8$, $SF_6$, a plasma containing F atoms generated from an upstream plasma generator, and mixtures thereof to the chamber; and forming the xenon difluoride by reacting xenon with the fluorine containing chemical in the chamber.

BRIEF DESCRIPTION OF THE DRAWINGS

FIG. 1 is a plot of the etch rate of a silicon substrate as a function of the level of Xe vis-à-vis Ar in an $NF_3$ remote plasma.

FIG. 2 is a plot of the etch rate of $SiO_2$ as a function of the level of Xe vis-à-vis Ar in an $NF_3$ remote plasma.

FIG. 3 is a plot comparing the etch selectivity of silicon to silicon dioxide as a function of the level of Xe vis-à-vis Ar in an $NF_3$ remote plasma.

FIG. 4 is a plot of Fourier Transform Infrared spectrum (FTIR) spectra from Ar/NF3 and Xe/NF3 in an $NF_3$ remote plasma.

FIG. 5 is a plot of Fourier Transform Infrared spectrum (FTIR) spectra from Xe/NF3 in an $NF_3$ remote plasma.

FIG. 6 is a plot of $XeF_2$ and $XeF_4$ Fourier Transform Infrared spectrum (FTIR) peak heights as a function of Xe/(Xe+Ar) in an $NF_3$ remote plasma.

FIG. 7 is a plot of $XeF_2$ and $XeF_4$ Fourier Transform Infrared spectrum (FTIR) peak heights as a function of $Xe/NF_3$ flow ratio in an $NF_3$ remote plasma.

FIG. 8 is a plot of $XeF_2$ Fourier Transform Infrared spectrum (FTIR) peak height and etch selectivity of silicon to silicon dioxide as a function of Xe/(Xe+Ar) in an $NF_3$ remote plasma.

FIG. 9 is a plot of the etch rate of TiN as a function of temperature and the level of Xe vis-à-vis Ar in an $N_{F3}$ remote plasma.

FIG. 10 is a plot of the etch rate of silicon dioxide as a function of temperature and the level of Xe vis-à-vis Ar in an $NF_3$ remote plasma.

FIG. 11 is a plot comparing the etch selectivity of TiN to silicon dioxide as a function of the level of Xe vis-à-vis Ar in an $NF_3$ remote plasma.

DETAILED DESCRIPTION OF THE INVENTION

The deposition of titanium nitride (TiN) is commonly practiced in the electronics industry in the fabrication of integrated circuits, electrical components and the like. In the deposition process some of the TiN is deposited on surfaces other than the surface of the target substrate, e.g., walls and surfaces within the deposition chamber. It has been found that $XeF_2$ is effective as a selective etchant for TiN contaminating silicon dioxide ($SiO_2$) and silicon nitride (SiN) surfaces. With this finding one can use xenon difluoride ($XeF_2$) as an etchant for removing unwanted TiN films and deposition materials contaminating surfaces such as those found in semiconductor reactor or deposition chambers, tools, equipment, parts, and chips coated or lined with silicon dioxide (quartz) or silicon nitride.

In the removal of unwanted TiN residues from $SiO_2$ and SiN surfaces, such as those in a deposition chamber, $XeF_2$ is contacted with the surface in a contact zone under conditions for converting TiN to volatile $TiF_4$, and then removing the volatile species from the contact zone. Often, the $XeF_2$ is added along with an inert gas, e.g., $N_2$, Ar, He, and the like.

In carrying out the process for removing TiN deposition materials from SiN and $SiO_2$ surfaces, $XeF_2$ may be preformed prior to introduction to the contact zone, or for purposes of this invention, and by definition herein, $XeF_2$ may be formed by two methods.

In one embodiment of the in situ formation of $XeF_2$, xenon (Xe) is added to a fluorine containing chemical and charged to a remote plasma generator. There Xe reacts with F atoms present in the resulting remote plasma to form $XeF_2$.

In the other embodiment, a variation of the in situ embodiment, the fluorine containing chemical is added to the remote plasma generator and then Xe and the remote plasma containing F atoms are added to a chamber downstream of the remote plasma generator. There Xe reacts with F atoms to form $XeF_2$ in the chamber. The chamber can be any type of a chamber, such as, but not limited to a processing chamber, a deposition chamber, a cleaning chamber, a reactor, and a plasma generator.

Illustrative of this fluorine containing chemical for forming $XeF_2$ includes $F_2$, $NF_3$, perfluorocarbons as $C_2F_6$, $CF_4$, $C_3F_8$, sulfur derivatives such as $SF_6$, and remote plasma containing F atoms generated from an upstream plasma generator. In the preferred embodiment $NF_3$ is used as the fluorine containing chemical for the formation of $XeF_2$.

The fluorine containing chemical can be generated onsite. For example, $F_2$ is generated onsite using a halogen generator and then introducing the $F_2$ to the process. This would be a possible means to mitigate the hazards associated with handling fluorine.

A wide range of Xe to fluorine containing chemical can be used in the in situ process of forming $XeF_2$. The mole ratio of Xe to fluorine containing chemical is dependant upon the amount of $XeF_2$ formed vis-à-vis the level of F atoms in the remote plasma.

Not being bound by theory it is believed that the remote plasma acts as a source for excitation and dissociation of the fluorine containing chemical that are introduced as the fluorine source. The fluorine radicals subsequently react with the Xe present in the region just after the plasma generation zone. The path length of this zone in addition to the energy used to excite the fluorine containing species as well as Xe, are believed to be critical parameters in balancing a preference for $XeF_2$ and a mitigation of $XeF_4$.

Furthermore, it is believed that if the Xe is introduced in the space just after the plasma excitation zone can lead to even further reductions in $XeF_4$ formation because the Xe has not been excited. It is well known that Xenon has a very low metastable energy state. The formation of this metastable state can lead to additional collisional reactions between $XeF_2$ molecules formed within this zone. These collisions could result in dissociation of $XeF_2$ to XeF and F radicals. These species could then lead to further reactions with other $XeF_2$ molecules to form $XeF_4$. Thus, by introducing the Xe post plasma excitation, the Xe metastables are not formed. Thus, the formation of $XeF_4$ will be decreased. This is disclosed in the second embodiment, i.e. the variation of the in situ embodiment, wherein Xe is added to remote plasma containing F atoms generated upstream in a plasma generator.

Preferred mole ratios are from 1:10 to 10:1 Xe to fluorine containing chemical. Optionally an inert gas, e.g., argon can be included in the remote plasma generation of $XeF_2$ as a means of adjusting the selectivity etching of TiN to $SiO_2$ and SiN or Si to $SiO_2$ and SiN.

Pressures suited for the removal of TiN from $SiO_2$ and SiN surfaces range from 0.5 to 50 Torr, preferably from 1 to 10 Torr. Temperatures for effecting selective etching of TiN films from silicon dioxide surfaces (quartz) and SiN surfaces depend primarily on which method the process is carried out. By that it is meant that if $XeF_2$ is preformed and added directly to the contact zone, temperatures should be elevated to at least 100° C., e.g., 100 to 800° C., preferably from 150 to 500° C. Pressures for $XeF_2$ should be at least 0.1 Torr, e.g., 0.1 to 20 Torr, preferably from 0.2 to 10 Torr. In contrast to prior art processes where the rate of etching (Si etching) decreases as the temperature is increased, here the rate of etching increases with an increase in temperature. It is believed the increase in temperature increases the rate of TiN etching because $TiF_4$ is volatile under these conditions and is easily removed from the $SiO_2$ and SiN surface. Lower temperatures leave $TiF_4$ species near the $SiO_2$ and SiN surfaces blocking the attack of $XeF_2$.

In the in situ process of forming $XeF_2$ cleaning or etching is done in the presence of a remote plasma. Temperatures when a remote plasma is present may range from ambient to 500° C., preferably from ambient to 300° C.

The disclosed processes of forming $XeF_2$ provide significant advance for the in situ cleaning process. In that, they not only provide a process to produce $XeF_2$ at a lower cost, they also provides an effective, selective removal of unwanted residues without requiring a major shut down, further lower the cost of maintenance. In addition, the disclosed processes use high vapor pressure gases rather than a low vapor pressure solid. This improves productivity since higher gas flows, and hence higher etch rates, are possible.

A further benefit from using the disclosed processes of forming $XeF_2$, is that in addition to $XeF_2$ some free fluorine radicals will also be provided which might help facilitate the removal of residues that may not be reactive when in contact with just $XeF_2$. This is beneficial to all selective cleaning/etching applications, such as cleaning parts and semiconductor tools coated with $SiO_2$ having some residues deposited unwanted thereon; the etching of sacrificial layers in a MEMS, and the residue cleaning in the ion source region of an ion implantation system used in the fabrication of a microelectronic device.

The following examples are provided to illustrate various embodiments of the invention and are not intended to restrict the scope thereof.

EXAMPLE 1

Effectiveness of $XeF_2$ in Etching of Deposition Materials at Various Temperatures and Pressures In this example, the etch rates for TiN, $SiO_2$, and SiN were determined using $XeF_2$ as the etchant at various temperatures and pressures. Experimental samples were prepared from Si wafers coated with thin films of TiN, $SiO_2$, and SiN. Etch rates were calculated by the thin film thickness change between the initial film thickness and that thickness after a timed exposure to the etching or processing conditions.

To effect etching bulk $XeF_2$ gas was introduced from a cylinder into the reactor chamber through an unused remote plasma generator. The $XeF_2$ gas pressure in the reactor chamber was held constant by turning off the flow from the cylinder once the desired pressure was reached.

The test coupons were placed on the surface of a pedestal heater which was used to maintain different substrate temperatures. The results are shown in Table I below.

TABLE I

ETCH RATES FOR VARIOUS MATERIALS USING $XeF_2$

| Material | Temperature (° C.) | Pressure (Torr) | Etch Rate (nm/min) |
| --- | --- | --- | --- |
| TiN | 25 | 1 | 0 |
| TiN | 100 | 1 | 0 |
| TiN | 150 | 1 | 8 |
| TiN | 200 | 1 | 13 |
| TiN | 300 | 0.5 | 20 |
| $SiO_2$ | 300 | 0.5 | 0 |
| SiN | 100 | 1 | 0 |
| SiN | 150 | 1 | 0 |
| SiN | 300 | 1 | 0 |

The above results show that at a pressure of 0.5 to 1 Torr, $XeF_2$ was effective in etching TiN films at elevated temperatures of from 150 to 300° C. and not effective at 25° C. room temperature. Surprisingly $XeF_2$ did not etch an $SiO_2$ or an SiN surface at any of the temperatures and pressures employed but did etch TiN films at such temperatures. Because of the inability of $XeF_2$ to etch $SiO_2$ and SiN surfaces at these elevated temperatures, but did etch TiN films, it was concluded that $XeF_2$ could be used as a selective etching agent for TiN films and particles from $SiO_2$ and SiN surfaces.

EXAMPLE 2

Selective Etching of Si to SiO2

In this example, an MKS Astron remote plasma generator was mounted on top of a reactor chamber. The distance between the exit of the Astron generator and the sample coupon was about six inches. The remote plasma generator was turned on but the pedestal heater in the reactor chamber was turned off. The chamber was kept at room temperature. The etch rate of both Si and $SiO_2$ substrates using remote plasma was measured.

The process gas to the remote plasma was $NF_3$ and it was mixed with a second gas stream in various amounts. The second gas stream was comprised of either Xe, argon (Ar), or a combination thereof. The total gas flowrate to the reactor chamber was fixed at 400 sccm and the $NF_3$ flowrate was fixed at 80 sccm. While keeping the total flowrate of the second gas stream at 320 sccm, the ratio of the flowrate of Xe to the total flowrate of the second gas stream (Xe/(Ar+Xe)) was varied between 0 (only Ar as the additional process gas) and 1 (only Xe as the additional process gas). The results of Si substrate etching are shown in FIG. 1 and the results of $SiO_2$ substrate etching are shown in FIG. 2.

As FIG. 1 shows, addition of Xe to the process gas, $NF_3$, enhanced the Si etch rate. What was unexpected is that the addition of Xe to a remote plasma generator along with $NF_3$ would generate a plasma that enhanced Si etching.

FIG. 2 shows that the addition of Xe to an $NF_3$/argon plasma inhibited the $SiO_2$ substrate etch rate and this was unexpected. F atoms present in a remote plasma usually attack $SiO_2$ based substrates.

Along with the analysis of FIG. 1, it was surmised that the addition of Xe to the plasma resulted in enhancing Si substrate etching, but reducing or inhibiting $SiO_2$ substrate etching as noted in Example 1.

FIG. 3 is provided to compare the effect of the addition of Xe to the $NF_3$ process gas on the etch selectivity for Si vis-à-vis $SiO_2$. As can be seen by comparing the results in FIGS. 1 and 2, FIG. 3 shows that the etch selectivity for Si relative to $SiO_2$ increased as the amount of Xe in the process gas was increased. Specifically, the selectivity increased from 30 to 250 (>8 times) as the percentage of Xe in the gas stream was increased from 0% to 100%.

Typical sacrificial materials in MEMS are: silicon, molybdenum, tungsten, titanium, zirconium, hafnium, vanadium, tantalum, niobium. Typical protective materials are nickel, aluminum, photoresist, silicon oxide, silicon nitride.

EXAMPLE 3

Selective Etching of Molybdenum(Mo) to $SiO_2$

A large 2.5 m length 25 cm diameter cylindrical SS etch chamber was used to determine etch rate of another common sacrificial material in MEMS applications: molybdenum (Mo). The remote plasma was generated using a water-cooled MKS Astron AX7670 6 slpm unit. The plasma source was connected to the chamber by a 10 cm long transport tube with a 4 cm inner diameter. The sample was placed 2 feet from the loading/unloading end of the tube.

At 2.75 torr, 275 sccm NF3 flow and 600 sccm Xe or Ar flow, etch rate of Mo=1.1 microns/min. Etch rate of $SiO_2$ was 82 nm/min for $NF_3$/Ar gas mixture and was 26 nm/min for $NF_3$/Xe mixture. Thus, selectivity of Xe/$NF_3$ mixture was at least 3 times that of Ar/$NF_3$ mixture. Note that Mo etch rate is limited by the surface oxide. With a surface preparation treatment to break its native oxide, the etch rate of Mo can be enhanced to >2.7 micron/min.

EXAMPLE 4

In Situ Formation of $XeF_2$ Via Reaction of Xe and $NF_3$

In this example the procedure of Example 2 was followed. An Applied Materials P5000 Dx72 PECVD chamber fitted with a 6 slpm MKS Astron eX remote plasma generator was used for Fourier Transform Infrared spectrum (FTIR) studies. The FTIR measurements were made downstream of the chamber pump at ambient pressure. A 5.6 m path length cell at 150° C. was used. Instrument resolution was 2 $cm^{-1}$.

FIG. 4 shows the FTIR spectra collected under same conditions as in Example 2: pressure of 4 torr, total gas flow of 400 sccm, $NF_3$ flow of 80 sccm, total flow of Xe and Ar of 320 sccm. Clear dominant peaks were seen in the 500-600 $cm^{-1}$ range in the Xe/$NF_3$ spectra whereas Ar/$NF_3$ spectra showed no peaks in that region. The two major peaks at 551.5 $cm^{-1}$ and 570.3 $cm^{-1}$ were identified as $XeF_2$ peaks. Reference spectra from $XeF_3$ manufacturers showed peak positions at 550.8 and 566.4 $cm^{-1}$.

FIG. 5 shows that where Xe and $NF_3$ were present, 3 dominant peaks were observed at 551, 570 and 590 $cm^{-1}$. $XeF_2$ was identified by peaks at 551, 567 $cm^{-1}$ whereas $XeF_4$ is detected at 580, 590 $cm^{-1}$. The peak at 567 $cm^{-1}$ was therefore a combination of the 567 and 580 $cm^{-1}$ peaks. Thus, both $XeF_2$ and $XeF_4$ were formed in the Xe/$NF_3$ mixture. No evidence of $XeF_6$ or $XeOF_4$ formation was found from FTIR spectra.

Table II shows several conditions where pressure was varied from 0.5 to 5 torr, Xe flow rate was varied from 200-1000 sccm, and $NF_3$ flow rate was varied from 50 to 500 sccm. In all cases, $XeF_2$ peaks were detected. The peak values were recorded here.

TABLE II

| Pressure (torr) | 0.5 | 4 | 5 | 2.75 | 5 | 2 |
|---|---|---|---|---|---|---|
| NF3 (sccm) | 50 | 80 | 200 | 275 | 50 | 500 |
| Xe (sccm) | 200 | 320 | 500 | 600 | 1000 | 1000 |
| Peak Value (530.1 cm − 1) | 0.06 | 0.07 | 0.16 | 0.22 | 0.09 | 0.33 |
| Peak value (570.3 cm − 1) | 1.01 | 1.18 | 1.35 | 1.35 | 1.36 | 1.42 |
| Peak value (590 cm − 1) | 0.43 | 0.43 | 1.63 | 1.42 | 0.18 | 1.58 |
| Peak Value (603.1 cm − 1) | 0.07 | 0.07 | 0.44 | 0.27 | 0.04 | 0.31 |

The peaks tended to saturate under some conditions, hence the leading edge of the $XeF_2$ peak at 520.1 cm$^{-1}$ and the trailing edge of the $XeF_4$ peak at 603.1 cm$^{-1}$ were analyzed in addition. The $XeF_2/XeF_4$ ratio was defined as the ratio of peak height values at 530 cm$^{-1}$ and 603 cm$^{-1}$.

The experimental results using response surface regression were summarized below in Table III.

TABLE III

| Peak Height | 530.1 | 551.5 | 592 | 603.1 | Ratio 603.1/530.1 |
|---|---|---|---|---|---|
| Significance | Leading XeF2 signal | XeF2 max | XeF4 max | Trailing XeF4 signal | XeF2/XeF4 |
| Xe | Weak | Moderate | Weak | Weak | Strong up |
| NF3 | Strong | Strong | Strong | Strong | Strong down |
| P | Weak | Moderate | Strong | Strong | Strong down |

Note that the flow of Xe is > the flow of $NF_3$ under all conditions here, so $NF_3$ was a stronger factor. Higher $NF_3$ flow increased both $XeF_2$ and $XeF_4$ peaks, and Xe had a weak influence on the peaks (due to excess Xe being present). Pressure had a weak effect on $XeF_2$ peaks but strong on $XeF_4$ peaks. Astron operating pressure is typically 1-10 torr.

Therefore, pressure is a key parameter to control the formation of $XeF_4$, $XeF_4$ can hydrolyze to produce $XeO_3$—which is an explosive and shock sensitive compound. Under the current experimental conditions, the $XeF_2/XeF_4$ ratio can be maximized under high Xe, low $NF_3$ and low pressure conditions. For example, the flow rate of Xe was 1000 sccm, the flow rate of $NF_3$ was 50 sccm, the pressure was at 0.5 torr.

FIG. 6 shows the $XeF_2$ FTIR peak height and $XeF_4$ FTIR peak height as a function of Xe/(Xe+Ar). The unit for the peak height was arbitrary. As Xe flow fraction increased, $XeF_2$ produced increased and $XeF_4$ fraction decreased. High Xe flow desired to maximize the formation of $XeF_2$ relative to $XeF_4$. FIG. 7 shows the ratio of $Xe_{F2}/Xe_{F4}$ FTIR peak heights as a function of the ratio of Xe/NF3 flow rates. Clearly, high ratios of Xe/NF3 were desired to maximize the formation of $Xe_{F2}$ relative to $Xe_{F4}$ FIG. 8 shows the $XeF_2$ FTIR peak height (right Y-axis) and the etch selectivity of $Si/SiO_2$(left Y-axis) as a function of Xe/(Xe+Ar). The etch selectivity of $Si/SiO_2$ was clearly correlated with the in situ formation of $XeF_2$.

The use of plasma excitation to produce $XeF_2$ can also be used to manufacture $XeF_2$ for use as an etchant in processes not directly associated with where it was made. The data shows that there are conditions that clearly benefit the production of $XeF_2$ and minimize the production of $XeF_4$. It is very desirable to minimize the production of $XeF_4$ because of its explosivity if it subsequently reacts to form $XeO_3$. As $XeF_2$ is formed in the reaction zone after the plasma generator it can be removed from the zone by the use of cryogenic trapping to condense out the material onto a cold surface. The solid $XeF_2$ can then be extracted from the process chamber and reloaded into delivery cylinders for use in etching processes. Because of the excess xenon is introduced to reduce $XeF_4$ formation, it is very beneficial to utilize xenon recovery or recycling of the xenon back into the process to assure productive use of all the xenon required for the manufacture of $XeF_2$.

EXAMPLE 5

Effect of Remote Plasma and Temperature on Etch Rate of TiN and $SiO_2$

In this example the procedure of Example 2 was followed except both the remote plasma generator and the pedestal heater were turned on to allow for determination of the etch rate of both TiN and $SiO_2$ using remote plasma at various substrate temperatures.

In a first set of experiments the etch rate of TiN and $SiO_2$ was measured using a mixture of $NF_3$ and Xe as the process gas. The flowrate of Xe was fixed at 320 sccm. The temperature was varied from 100° C. to 150° C. The results of these experiments are shown as the square points in FIGS. 9 and 10 for TiN and $SiO_2$, respectively.

In a second set of experiments the etch rate of TiN and $SiO_2$ was measured using a mixture of $NF_3$ and argon (Ar) as the process gas. The flowrate of Ar was fixed at 320 sccm. The temperature was varied from 100° C. to 150° C. The results of these experiments are shown as the diamond points in FIGS. 4 and 5 for TiN and $SiO_2$, respectively.

As FIG. 9 shows, the addition of Xe to the process gas enhanced the TiN etch rate at temperatures generally above 130° C. FIG. 10 shows that the addition of Xe to $NF_3$ inhibited the $SiO_2$ etch rate for all temperatures studied vis-à-vis the addition of Ar to $NF_3$. The effect of the addition of Xe to the process gas on the etch selectivity can be seen by comparing the results in FIGS. 9 and 10.

FIG. 11 shows, the etch selectivity for TiN relative to $SiO_2$ and the graph shows that the TiN selectivity begins to increase at temperatures above about 110° C., and rapidly above 120° C., with the addition of Xe to the $NF_3$ process gas relative to Ar.

Summarizing, Example 1 shows that $XeF_2$ is a selective etchant for TiN films in relation to silicon dioxide and silicon nitride substrates when such etching is performed at elevated temperatures.

Examples 2 and 3 shows that the addition of Xe to an $NF_3$ process gas in a remote plasma generator (or a reactor or a chamber) can increase the etch selectivity of Si or Mo relative to $SiO_2$ as compared to the etch selectivity when only $NF_3$ is used as the process gas.

Example 4 shows that when Xenon and a fluorine containing gas such as $NF_3$ were introduced to a plasma generator (or a reactor or a chamber), in situ formation of $XeF_2$ was observed. There is an economic advantage (i.e., lower cost of ownership) of combining xenon with a fluorine containing gas such as $NF_3$ rather than directly employing $XeF_2$ for a cleaning process. A further benefit from using the disclosed processes of forming $XeF_2$ is that they provide in addition to $XeF_2$ some free fluorine radicals which help facilitate the removal of residues that may not be reactive when in contact with just $XeF_2$.

Example 5 shows that the addition of Xe to an $NF_3$ process gas in a remote plasma can increase the etch selectivity of TiN relative to $SiO_2$ at high (elevated) temperatures as compared to the etch selectivity when only $NF_3$ is used as the process gas. The increased selectivity of TiN relative to $SiO_2$ is important in quartz tube furnace applications and to parts and semiconductor tools coated with $SiO_2$ having TiN deposits thereon. This methodology may facilitate the cleaning of deposition reactors in between deposition cycles by interfacing a remote downstream plasma unit onto the process reactor and admitting the process gases. There may be economic advantages (i.e., lower cost of ownership) of combining xenon with a fluorine containing gas such as $NF_3$ rather than employing $XeF_2$ for such a cleaning process.

The cleaning processes described in the examples could also be employed in an off-line process reactor whose sole purpose is to clean process reactor parts prior to their re-use. Here, a remote downstream plasma reactor would be interfaced onto an off-line process reactor into which parts (components from the deposition reactor) are placed. Xenon and a fluorine containing gas such as $NF_3$ would then be introduced to the remote downstream unit prior to the admission of the process gases into the chamber containing the parts to be cleaned.

The increased selectivity of Si, Mo, or TiN relative to $SiO_2$, and the disclosed processes of forming $XeF_2$ are important in many applications: such as, cleaning parts and semiconductor tools coated with $SiO_2$ having Si, Mo, or TiN deposits unwanted thereon; the etching of sacrificial layers in a MEMS; and the residue cleaning in the ion source region of an ion implantation system used in the fabrication of a microelectronic device.

The applications can be extended to clean other unwanted materials such as: tungsten, titanium, zirconium, hafnium, vanadium, tantalum, niobium, boron, phosphorus, germanium, arsenic, and mixtures; from $Si_3N_4$, Al, $Al_2O_3$, Au, Ga, Ni, Pt, Cu, Cr, TiNi alloy, SiC, photoresist, phosphosilicate glass, boron phosphosilicate glass, polyimides, gold, copper, platinum, chromium, aluminum oxide, silicon carbide and the combinations thereof.

The invention claimed is:

1. A process for selective etching of a first material to a second material, comprising:
   providing a structure containing the first material and the second material in a chamber;
   providing an etchant gas to the chamber; wherein the etchant gas comprising of an inert gas, xenon(Xe) gas, and a fluorine containing chemical;
   contacting the structure with the etchant gas and selectively converting the first material to a volatile species; and removing the volatile species from the chamber;
   wherein the first material is silicon, and the second material is silicon dioxide, and etch ratio of the first material to the second material from 30 to 250;
   wherein the pressure in the chamber is from 0.1 to 10 Torr and the mole ratio of Xe to fluorine containing chemical is from 1:10 to 10:1.

2. The process of claim 1 wherein the fluorine containing chemical is selected from the group consisting of $F_2$, $NF_3$, $C_2F_6$, $CF_4$, $C_3F_8$, $SF_6$, a plasma containing F atoms generated from an upstream plasma generator, and mixtures thereof.

3. The process of claim 1 wherein the fluorine containing chemical is a plasma containing F atoms generated from an upstream plasma generator.

4. The process of claim 1 wherein the inert gas is selected from the group consisting of Xe, Ar, He and mixtures thereof.

5. The process of claim 1 wherein the chamber contains a remote plasma generator.

6. The process of claim 1 wherein the temperature in the chamber is from ambient temperature to 500° C.

7. The process of claim 1 wherein the structure is a semiconductor device or a semiconductor processing chamber.

8. The process of claim 1 wherein the structure is a micro electro mechanical device.

9. The process of claim 1 wherein the structure is an ion implanter tool in an ion implantation system.

* * * * *